(12) United States Patent
Tan et al.

(10) Patent No.: US 9,983,280 B2
(45) Date of Patent: May 29, 2018

(54) LOCAL COIL

(71) Applicants: Jia Heng Tan, Shenzhen (CN); Tong Tong, Shenzhen (CN); Markus Vester, Nürnberg (DE); JianMin Wang, Shenzhen (CN)

(72) Inventors: Jia Heng Tan, Shenzhen (CN); Tong Tong, Shenzhen (CN); Markus Vester, Nürnberg (DE); JianMin Wang, Shenzhen (CN)

(73) Assignee: Siemens Aktiengesellschaft, München (DE)

( * ) Notice: Subject to any disclaimer, the term of this patent is extended or adjusted under 35 U.S.C. 154(b) by 738 days.

(21) Appl. No.: 14/249,926

(22) Filed: Apr. 10, 2014

(65) Prior Publication Data

US 2014/0312902 A1 Oct. 23, 2014

(30) Foreign Application Priority Data

Apr. 11, 2013 (CN) .......................... 2013 1 0125226

(51) Int. Cl.
G01R 33/36 (2006.01)
G01R 33/34 (2006.01)
G01R 33/341 (2006.01)

(52) U.S. Cl.
CPC ........ G01R 33/3657 (2013.01); *G01R 33/341* (2013.01)

(58) Field of Classification Search
CPC .. G01R 33/341; G01R 33/3657; G01R 33/36; G01R 33/3642; G01R 33/3628

(Continued)

(56) References Cited

U.S. PATENT DOCUMENTS 5,144,244 A 9/1992 Kess
2008/0231282 A1\* 9/2008 Griswold ........... G01R 33/3415
324/322

(Continued)

FOREIGN PATENT DOCUMENTS

CN 101573630 A 11/2009
CN 103547937 A 1/2014

(Continued)

OTHER PUBLICATIONS

Chinese Office Action for related Chinese Application No. 201310125226.X dated Apr. 6, 2016.

(Continued)

*Primary Examiner* — Rishi Patel
(74) *Attorney, Agent, or Firm* — Lempia Summerfield Katz LLC

(57) ABSTRACT

A local coil for an MRI system includes a signal antenna to receive a magnetic resonance signal and a tuning/detuning circuit to subject the signal antenna part to switch control according to a control signal. The tuning/detuning circuit is connected to the signal antenna part. The tuning/detuning circuit includes a control signal interface, a resonant circuit and an AC/DC conversion circuit. The control signal interface receives the control signal. The resonant circuit includes a diode. The AC/DC conversion circuit converts an alternating current generated by an electromagnetic wave to a direct current. The AC/DC conversion circuit is connected in series with the diode. A small detuning control current may be used, and detuning control circuitry may be reduced.

18 Claims, 1 Drawing Sheet

(58) Field of Classification Search
USPC ................................. 324/307, 309, 318, 322
See application file for complete search history.

(56) References Cited

U.S. PATENT DOCUMENTS

2010/0039113 A1* 2/2010 Vartiovaara ........ G01R 33/3657
324/322
2014/0070808 A1* 3/2014 Reykowski ........ G01R 33/3628
324/309

FOREIGN PATENT DOCUMENTS

EP    1199577  A2    4/2002
GB    2288024  A    10/1995

OTHER PUBLICATIONS

Chinese Office Action for related Chinese Application No. 201310125226.X dated Nov. 30, 2016.
Chinese Office Action for related Chinese Application No. 201310125226.X dated Sep. 6, 2017.

* cited by examiner

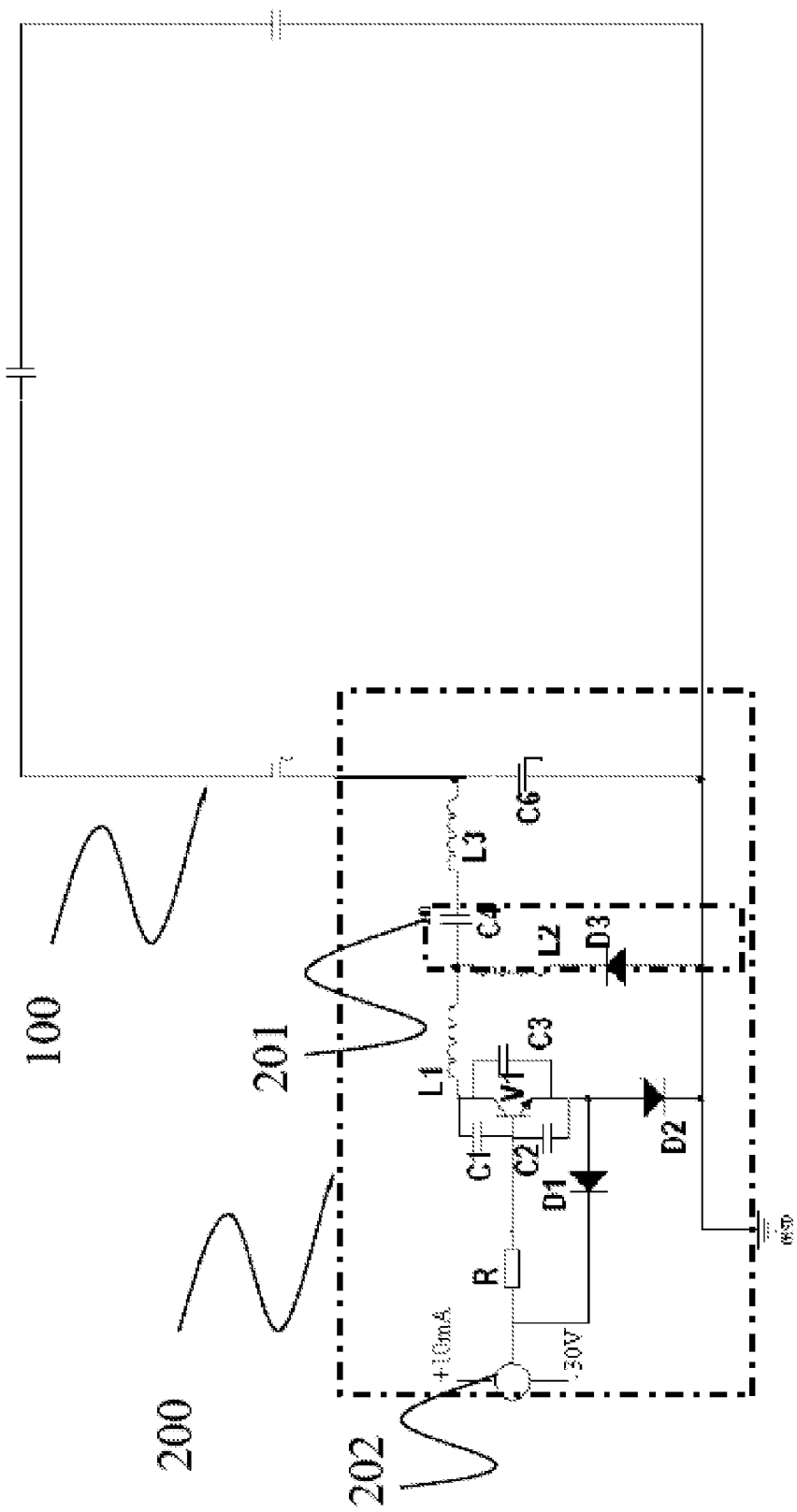

LOCAL COIL

This application claims the benefit of CN 201310125226.X, filed on Apr. 11, 2013, which is hereby incorporated by reference in its entirety.

BACKGROUND

The disclosed embodiments relate to magnetic resonance imaging systems, and to a local coil for a magnetic resonance imaging system.

Magnetic resonance imaging (MRI) is a technology in which the phenomenon of magnetic resonance is utilized for the purpose of imaging. The main principles of magnetic resonance are as follows. Where an atomic nucleus contains a single proton (e.g., the nuclei of the hydrogen atoms present throughout the human body), the proton exhibits spin motion and resembles a small magnet. Moreover, the spin axes of these small magnets lack a definite pattern. If an external magnetic field is applied, the small magnets are rearranged according to the magnetic force lines of the external field. The magnets line up in one of two directions, either parallel or anti-parallel to the magnetic force lines of the external magnetic field. The direction parallel to the magnetic force lines of the external magnetic field is called the positive longitudinal axis, while the direction anti-parallel to the magnetic force lines of the external magnetic field is called the negative longitudinal axis. The atomic nuclei only have a longitudinal magnetization component, which has both a direction and a magnitude. A radio frequency (RF) pulse of a specific frequency is used to excite the atomic nuclei in the external magnetic field such that the spin axes of the nuclei deviate from the positive longitudinal axis or negative longitudinal axis, giving rise to resonance. This is the phenomenon of magnetic resonance. Once the spin axes of the excited atomic nuclei deviate from the positive or negative longitudinal axis, the atomic nuclei have a transverse magnetization component. Once emission of the RF pulse has ended, the excited atomic nucleus emits an echo signal, gradually releasing the absorbed energy in the form of electromagnetic waves. The phase and energy level of the nucleus both return to the pre-excitation state. An image is reconstructed by subjecting the echo signal emitted by atomic nuclei to further processing, such as spatial encoding.

An MRI system includes more than one type of coil, such as a body coil covering the entire body and a local coil covering just part of the body. Local coils with a receiving antenna are widely used in MRI systems. Local coils are suitable for various parts of the body of different sizes, and provide a good signal-to-noise ratio. Local coils may also have multiple uses. For example, flexible coils manufactured by Siemens AG may be used for magnetic resonance imaging of various parts of the body, including the chest, abdomen, elbow, knee, ankle and head.

A tuning/detuning circuit in a local coil is incorporated into the coil to safeguard patient safety and the reliability of the coil itself. The tuning/detuning circuit uses a capacitor and an inductor in the antenna part of the local coil to form a parallel resonant circuit. The tuning/detuning circuit also includes a PIN diode. The tuning/detuning circuit forms a loop and resonates only when the PIN diode is conducting. When the local coil is not operating, the diode in the tuning/detuning circuit is switched on with a current of 100 mA to create resonance. The resonance establishes an open circuit in the antenna part that produces a detuning effect. However, current technology has the following shortcomings:

1) Each local coil requires a 100 mA current. An MRI system is often equipped with eight interfaces, each of which is equipped with eight detuning control lines. The total current involved is thus 8*8*100=6400 mA.

2) An additional pin multiplexing circuit is used when two or more local coils are used to multiplex a pin due to a shortage of detuning control lines. The pin multiplexing circuit controls a series connection of the diode when 100 mA is used for detuning, and controls a parallel connection of the diode when −31 V is used for tuning. When a diode multiplexing circuit is used, one of the diodes is unable to use an RF ground pin to form a DC loop because a diode is used to block a DC signal when 100 mA is used for detuning. The 100 mA DC flows in through a first local coil, but flows back via the ground line of the last local coil. Consequently, in spatial terms the 100 mA current travels a very large loop, which may affect the $B_0$ or $B_1$ field if not addressed appropriately. Furthermore, the number of diodes and inductors that may be connected in series in a diode multiplexing circuit is limited because the voltage of a constant current source is limited.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the disclosed embodiments may provide a local coil for an MRI system including a signal antenna component (e.g., part) to receive a magnetic resonance signal, and a tuning/detuning circuit part to subject the signal antenna part to switch control according to a control signal. The tuning/detuning circuit component (e.g., part) is connected to the signal antenna part. The tuning/detuning circuit includes a control signal interface, a resonant circuit and an AC/DC conversion circuit. The control signal interface receives the control signal. The resonant circuit includes a diode. The AC/DC conversion circuit converts an alternating current generated by an electromagnetic wave to a direct current, and the AC/DC conversion circuit is connected in series with the diode.

In one embodiment, the control signal includes a DC voltage signal, and the control signal interface is connected to the diode. A direct current from the AC/DC conversion circuit makes the diode conduct. The DC voltage signal of the control signal shuts off the diode.

In one embodiment, the DC voltage signal is a negative voltage, and the control signal interface is connected to the anode of the diode.

In one embodiment, the DC voltage signal is a positive voltage, and the control signal interface is connected to the cathode of the diode.

In one embodiment, the control signal further includes a direct current signal. A direct current from the AC/DC conversion circuit and the direct current signal of the control signal make the diode conduct.

In one embodiment, the tuning/detuning circuit further includes a bipolar junction transistor connected in series with the diode. The base of the bipolar junction transistor is connected to the control signal interface, and the control signal includes a direct current signal and a DC voltage signal. The direct current signal of the control signal makes the bipolar junction transistor conduct, while a direct current from the AC/DC conversion circuit and the direct current signal of the control signal make the diode conduct. Alternatively or additionally, the DC voltage signal of the control signal shuts off the bipolar junction transistor.

In one embodiment, the emitter of the bipolar junction transistor is connected to the anode of the diode, and the collector of the bipolar junction transistor is connected to the AC/DC conversion circuit.

In one embodiment, the collector of the bipolar junction transistor is connected to the cathode of the diode, and the emitter of the bipolar junction transistor is connected to the AC/DC conversion circuit.

In one embodiment, the AC/DC conversion circuit is a rectifier circuit formed by an inductor and a diode connected in series.

In one embodiment, the electromagnetic wave includes an RF pulse of the MRI system.

In one embodiment, the resonant circuit is a resonant circuit in which a capacitor and an inductor are connected in parallel.

In one embodiment, the diode is a PIN diode.

The disclosed embodiments may provide a MRI system including any one of the above local coils.

The local coil of the disclosed embodiments may replace a large detuning control current with a small detuning control current. With 10 mA and 100 mA as an example, the 100 mA detuning control current may instead supply simultaneously a detuning control current to as many as 10 local coils in some embodiments. Savings may thus be realized on the tuning/detuning control current and control modules of the system. The detuning control circuitry in the interface may also be reduced. Thus, the system design is convenient and energy is saved, making the system environmentally friendly. Furthermore, the original pin multiplexing circuit may be eliminated in the coil, which avoids disposing surrounding DC leads in the pin multiplexing circuit that may otherwise affect the $B_0$ and $B_1$ fields. The local coil may be well suited to local coils with a very large number of units.

BRIEF DESCRIPTION OF THE DRAWINGS

FIG. 1 is a circuit diagram of a local coil according to one embodiment.

DETAILED DESCRIPTION

The disclosed embodiments provide a local coil for an MRI system. The local coil includes a signal antenna part to receive a magnetic resonance signal, and a tuning/detuning circuit part to subject the signal antenna part to switch control according to a control signal. The tuning/detuning circuit part is connected to the signal antenna part. The tuning/detuning circuit includes a control signal interface, a resonant circuit and an AC/DC conversion circuit. The control signal interface receives the control signal, the resonant circuit includes a diode, the AC/DC conversion circuit converts an alternating current generated by an electromagnetic wave to a direct current, and the AC/DC conversion circuit is connected in series with the diode. The diode is a PIN diode.

Electromagnetic waves are ubiquitous in the air. In some embodiments, the electromagnetic waves include RF pulses of the MRI system utilized by the local coil. Other electromagnetic wave sources may be used, such as electromagnetic waves from a magnet separate from the MRI system.

An identical detuning effect is achieved in the local coil according to some embodiments by replacing a 100 mA detuning control current with the combined action of a 10 mA detuning control current and a direct current converted from an alternating current generated by an RF pulse of the MRI system. A rectifier circuit is introduced in the PIN diode and RF pulse receiving unit because an RF pulse gives rise to an alternating current but a direct current is used to make a PIN diode conduct. An alternating current generated by an RF pulse of the MRI system is converted to a direct current via the rectifier circuit. The conducting current of the PIN diode is thus increased, thereby achieving the same detuning effect as that of a 100 mA detuning control current.

In the local coil according to some embodiments, the resonant circuit is a resonant circuit in which a capacitor and an inductor are connected in parallel. Tuning of the resonant circuit acts as having an open circuit. Consequently, when the resonant circuit is tuned, the local coil is in an open circuit state. The local coil is thus unable to receive a magnetic resonance echo signal. At this moment, the MRI system emits an RF pulse, and the local coil utilizes the direct current produced by rectification of the alternating current generated by the electromagnetic wave of the RF pulse to tune the resonant circuit. The local coil is thus placed into an open circuit state, shutting off the local coil.

FIG. 1 is a circuit diagram for the local coil according to one embodiment. As shown in FIG. 1, the tuning/detuning circuit uses a voltage of −30 V to implement tuning control to dispose the coil in a tuned state, and uses a current of 10 mA to implement detuning control to dispose the coil into a detuned state. The local coil according to the embodiment of FIG. 1 includes a signal antenna component (e.g., part) 100 and a tuning/detuning circuit component (e.g., part) 200. The signal antenna part 100 is used for receiving a magnetic resonance signal emitted from an examination subject. The signal antenna part transmits the magnetic resonance signal received to the MRI system for further processing. The tuning/detuning circuit part 200 is connected to the signal antenna part 100. The principal function of the tuning/detuning circuit part 200 is to subject the signal antenna part 100 to tuning control via a −30 V voltage, and subject the signal antenna part 100 to detuning control via a 10 mA current. The tuning/detuning circuit part 200 thus subjects the signal antenna part 100 to switch control. The tuning/detuning circuit part 200 includes a control signal interface for receiving a control signal, i.e. a −30 V voltage or a 10 mA current. The tuning/detuning circuit part 200 includes a resonant LC circuit connected to the signal antenna part 100. When the resonant LC circuit is tuned, the capacitors C6 and C3, the inductors L3 and L1, and the diode D2 are resonant in parallel, which is equivalent to an open circuit. Thus, the signal antenna part 100 is in an open circuit state and unable to receive a magnetic resonance echo signal. When the resonant LC circuit is detuned, only capacitor C6 is operational, and the other components (inductors L1 and L3, capacitor C3 and diode D2) are in a disconnected state. As a result, the signal antenna part 100 is in a closed circuit state and able to receive a magnetic resonance echo signal.

As shown in FIG. 1, the signal antenna part 100 of the local coil according to one embodiment includes a detuning capacitor C6 connected in parallel with the tuning/detuning circuit part 200. The tuning/detuning circuit part 200 includes a rectifier circuit 201, a control signal interface 202, a bipolar junction transistor V1 and a diode D2. The rectifier circuit 201 is connected in parallel with the bipolar junction transistor V1 and diode D2. The bipolar junction transistor V1 and the diode D2 are connected in series. The base of the bipolar junction transistor V1 is connected to a control signal having, e.g., a −30 V voltage or 10 mA current. The collector is connected to the output end of the rectifier circuit 201. The emitter is connected to the diode D2 and, in turn, to ground.

The signal antenna part 100 receives an electromagnetic wave from the air (e.g., an RF pulse emitted by the body coil of the MRI system) and converts the electromagnetic wave to AC. The signal antenna part 100 transmits the AC to the rectifier circuit 201 of the tuning/detuning circuit part. The rectifier circuit 201 converts the AC to DC. The rectifier circuit 201 transmits the DC to the collector of the bipolar junction transistor V1. The rectifier circuit includes a diode D3 and an inductor L2.

When the MRI system acts to direct the local coil to operate, e.g., directs the signal antenna part 100 to be tuned, the MRI system supplies a −30 V voltage as a control signal. When the base of the bipolar junction transistor V1 is connected to the −30 V voltage, the bipolar junction transistor V1 is in a switched-off state. At this time, the body coil of the MRI system does not emit an RF pulse, and, thus, the rectifier circuit 201 is unable to output a direct current. Therefore, the local coil of the embodiment of FIG. 1 is in a tuned state. As shown in FIGURE, the function of the diode D1 is to provide (e.g., ensure) effective shut-off of the bipolar junction transistor V1 when the −30 V control signal is applied.

When the MRI system does not wish to operate the local coil, e.g., directs the signal antenna part 100 to be detuned, the MRI system supplies a 10 mA current as a control signal. When the base of the bipolar junction transistor V1 is connected to the 10 mA current via a protecting resistor R, the bipolar junction transistor V1 conducts. Because the body coil of the MRI system is emitting an RF pulse at this time, the above situation results in the rectifier circuit 201 outputting a direct current, which is transmitted via the collector of the bipolar junction transistor V1 to the emitter. The direct current is, in turn, transmitted to the anode of the diode D2 so that the diode D2 conducts. Therefore the local coil according to the embodiment of FIG. 1 is in a detuned state. In other words, when the MRI system is not emitting an RF pulse, the signal causing the local coil to be detuned is provided solely via the 10 mA supplied by the MRI system. But when the MRI system is emitting an RF pulse, the rectifier circuit 201 (e.g., the series-connected diode D3 and inductor L2) rectifies the AC arising from the RF pulse into DC and outputs the DC to the collector of the bipolar junction transistor V1. The DC is then provided from the emitter of the bipolar junction transistor V1 to the anode of the diode D2 as a conducting current. In this way, the detuning current includes 10 mA plus the direct current supplied by the rectifier circuit 201, and so the detuning capacitor C6 and detuning inductor L3 are able to resonate effectively to achieve the effect of detuning the coil unit.

In another embodiment, the local coil may not include (e.g., dispense with) the bipolar junction transistor V1. Consequently, the control signal interface 202 (the 10 mA current or −30 V voltage) and the output end of the rectifier circuit 201 are connected to the anode of the diode D2 directly.

In the circuit structure of this embodiment, when the MRI system acts to direct the local coil to operate, e.g., directs the signal antenna part 100 to be tuned, the MRI system supplies a −30 V voltage as a control signal. When the anode of the diode D2 is connected to the −30 V voltage, the diode D2 is in a switched-off state. Therefore, the local coil is in a tuned state.

When the MRI system does not wish to operate the local coil, e.g., directs the signal antenna part 100 to be detuned, the MRI system supplies a 10 mA current as a control signal. The anode of the diode D2 is connected to the 10 mA current via the protecting resistor R. At the same time, the body coil of the MRI system emits an RF pulse that causes the rectifier circuit 201 to output a direct current. The direct current is outputted to the anode of the diode D2 to make the diode D2 conduct. Therefore, the local coil is in a detuned state. In other words, when the MRI system is not emitting an RF pulse, the signal causing the local coil to be detuned comes solely from the 10 mA supplied by the MRI system, and the signal is not sufficient to make the diode D2 conduct. But when the MRI system is emitting an RF pulse, the rectifier circuit 201 (e.g., the series-connected diode D3 and inductor L2) rectifies the AC arising from the RF pulse into DC to serve as part of the conducting current, and outputs the DC to the anode of the diode D2. In this way, the detuning current includes the 10 mA current plus the direct current supplied by the rectifier circuit 201. As a result, the detuning capacitor C6 and detuning inductor L3 are able to resonate to achieve the effect of shutting down the signal coil. In this case, the direct current of 10 mA serving as a control signal may be less than or even 0, because the direct current from the rectifier circuit may make the diode self-conduct (e.g., conduct on its own).

In order to convert the AC from the signal antenna part 100 to DC, diodes D2 and D3 are connected in a reverse parallel arrangement in various embodiments. The rectifier circuit 201 includes the series-connected diode D3 and inductor L2 configured as an AC/DC conversion circuit. However, the AC/DC conversion circuit is not limited to the structure of the rectifier circuit 201, but also encompasses, for instance, bridge rectifier circuits and full-wave rectifier circuits.

The local coil of the disclosed embodiments replaces a large detuning control current with a small detuning control current. Taking 10 mA and 100 mA as an example, if a 100 mA detuning control current may simultaneously supply a detuning control current to as many as 10 local coils, then savings may be provided in the tuning/detuning control current and control modules, of the system. The detuning control circuitry in the interface may also be reduced. Consequently, the system design is convenient. Furthermore, the original pin multiplexing circuit may be eliminated (e.g., dispensed with) when designing the coil, avoiding having surrounding DC leads in the pin multiplexing circuit that may otherwise affect the $B_0$ and $B_1$ fields. The disclosed embodiments are well-suited to coils with a very large number of units.

In experiments, a current of 61 mA was generated on the diode using the AC/DC conversion circuit of the local coil according to some embodiments. The size of the direct current generated was adjusted via the inductor in the AC/DC conversion circuit. When the emission voltage of the body coil is greater than 150 V, the current induced in the circuit is sufficient to detune the coil effectively. Increasing the emission voltage increased the detuning current and improved the detuning effect.

The above embodiments are merely preferred embodiments of the present invention, and are by no means intended to define the scope of protection thereof. Suitable improvements may be applied to the preferred embodiments according to the present invention during specific implementation, to suit the specific requirements of specific situations. Thus it can be appreciated that the particular embodiments of the present invention described herein merely serve a demonstrative purpose, and are by no means intended to limit the scope of protection of the present invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance imaging (MRI) system, the local coil comprising:
a signal antenna configured to receive a magnetic resonance signal; and
a tuning/detuning circuit connected to the signal antenna and configured to subject the signal antenna to switch control in accordance with a control signal, the control signal comprising a direct current signal and a DC voltage signal;
wherein the tuning/detuning circuit comprises a control signal interface configured to receive the control signal, a resonant circuit, a bipolar junction transistor, and an AC/DC conversion circuit,
wherein the resonant circuit comprises a diode, an emitter of the bipolar junction transistor is connected in series with ground via the diode, a collector of the bipolar junction transistor is connected to the AC/DC conversion circuit, and a base of the bipolar junction transistor is connected to the control signal interface,
wherein the AC/DC conversion circuit is configured to convert an alternating current generated by an electromagnetic wave of the received magnetic resonance signal to a direct current, and
wherein the direct current signal of the control signal is configured to make the bipolar junction transistor conduct, while the direct current from the AC/DC conversion circuit and the direct current signal of the control signal are configured to combine to make the diode conduct to ground, and
wherein the DC voltage signal of the control signal shuts off the bipolar junction transistor.

2. The local coil of claim 1, wherein the tuning/detuning circuit is configured such that the DC voltage signal of the control signal shuts off the diode.

3. The local coil of claim 2, wherein the DC voltage signal is a negative voltage.

4. The local coil of claim 3, wherein the DC voltage signal is −30 V or −31 V, and the direct current signal is 10 mA.

5. The local coil of claim 2, wherein the DC voltage signal is a positive voltage.

6. The local coil of claim 5, wherein the DC voltage signal is 30 V or 31 V, and the direct current signal is 10 mA.

7. The local coil of claim 1, wherein the emitter of the bipolar junction transistor is connected to an anode of the diode.

8. The local coil of claim 1, wherein the AC/DC conversion circuit is a rectifier circuit comprising an inductor and a diode connected in series.

9. The local coil of claim 1, wherein the electromagnetic wave of the received magnetic resonance signal comprises a radio frequency (RF) pulse of the MRI system.

10. The local coil of claim 1, wherein the resonant circuit is a resonant circuit in which a capacitor and an inductor are connected in parallel.

11. The local coil of claim 1, wherein the diode is a PIN diode.

12. An MRI system comprising:
a local coil comprising:
a signal antenna configured to receive a magnetic resonance signal; and
a tuning/detuning circuit connected to the signal antenna and configured to subject the signal antenna to switch control in accordance with a control signal, the control signal comprising a direct current signal and a DC voltage signal;
wherein the tuning/detuning circuit comprises a control signal interface configured to receive the control signal, a resonant circuit, a bipolar junction transistor, and an AC/DC conversion circuit,
wherein the resonant circuit comprises a diode, a collector of the bipolar junction transistor is connected in series with ground via the diode, an emitter of the bipolar junction transistor is connected to the AC/DC conversion circuit, and a base of the bipolar junction transistor is connected to the control signal interface,
wherein the AC/DC conversion circuit is configured to convert an alternating current generated by an electromagnetic wave of the received magnetic resonance signal to a direct current,
wherein the direct current signal of the control signal is configured to make the bipolar junction transistor conduct, while the direct current from the AC/DC conversion circuit and the direct current signal of the control signal make the diode conduct to ground, and
wherein the DC voltage signal of the control signal shuts off the bipolar junction transistor.

13. The MRI system of claim 12, wherein the tuning/detuning circuit is configured such that the DC voltage signal of the control signal shuts off the diode.

14. The MRI system of claim 13, wherein the DC voltage signal is a negative voltage.

15. The MRI system of claim 14, wherein the DC voltage signal is −30 V or −31 V, and the direct current signal is 10 mA.

16. The MRI system of claim 13, wherein the DC voltage signal is a positive voltage.

17. The MRI system of claim 16, wherein the DC voltage signal is 30 V or 31 V, and the direct current signal is 10 mA.

18. The MRI system of claim 12, wherein the collector of the bipolar junction transistor is connected to an anode of the diode.

* * * * *